United States Patent
Lai (10) Patent No.: US 8,461,857 B2
(45) Date of Patent: Jun. 11, 2013

(54) DISTANCE ADJUSTMENT SYSTEM FOR USE IN SOLAR WAFER INSPECTION MACHINE AND INSPECTION MACHINE PROVIDED WITH SAME

(75) Inventor: Chia-Hung Lai, Tao-Yuan Hsien (TW)

(73) Assignee: Chroma Ate Inc., Tao-Yuan Hsien (TW)

( * ) Notice: Subject to any disclaimer, the term of this patent is extended or adjusted under 35 U.S.C. 154(b) by 302 days.

(21) Appl. No.: 13/030,134

(22) Filed: Feb. 18, 2011

(65) Prior Publication Data

US 2012/0013897 A1 Jan. 19, 2012

(30) Foreign Application Priority Data

Jul. 16, 2010 (TW) .................................. 99123481

(51) Int. Cl.
*G01R 31/26* (2006.01)
(52) U.S. Cl.
USPC ............ 324/761.01; 324/750.16; 324/750.18; 324/750.23; 324/750.25; 414/416.03; 414/416.05
(58) Field of Classification Search
USPC ...... 324/750.16, 750.18, 750.19; 414/416.03, 414/416.05
See application file for complete search history.

(56) References Cited

U.S. PATENT DOCUMENTS

| | | | |
|---|---|---|---|
| 6,724,206 B2* | 4/2004 | Arakawa et al. | 324/750.19 |
| 7,479,779 B2* | 1/2009 | Kikuchi et al. | 324/750.23 |
| 2007/0040570 A1* | 2/2007 | Gopal et al. | 324/765 |
| 2011/0156734 A1* | 6/2011 | Berry et al. | 324/750.19 |

* cited by examiner

*Primary Examiner* — Richard Isla Rodas (57) ABSTRACT

The present invention relates to a distance adjustment system and a solar wafer inspection machine provided with the system. The inspection machine has a conveyer for carrying a solar wafer, an optical inspection system for inspecting the surface and color appearance of the wafer and an illumination inspection system. A holder is provided in the inspection position where the wafer is clamped along its width direction to prevent the wafer from offset. During the opto-electrical inspection, probes are brought into contact with conductive buses of the wafer and light is applied to the wafer to allow the probing of electric energy thus generated. An adjusting device is employed to adjust the clamping gap of the holder and the distance of the probes in accordance with the size of the solar wafer. The data are collected and transmitted to a sorting system for sorting the wafer.

10 Claims, 7 Drawing Sheets

DISTANCE ADJUSTMENT SYSTEM FOR USE IN SOLAR WAFER INSPECTION MACHINE AND INSPECTION MACHINE PROVIDED WITH SAME

FIELD OF THE INVENTION

The present invention relates to a distance adjustment system and a solar wafer inspection machine provided with said system, and more particularly, to a distance adjustment system which performs the adjustment in accordance with the width dimension of the solar wafers to be tested and a solar wafer inspection machine provided with said system.

DESCRIPTION OF THE RELATED ART

Green power sources, such as solar energy, are becoming increasingly popular. Solar energy is normally converted to electrical power using solar cells. As solar cells continue to increase in popularity, they should stand up to the scrutiny of quality control before packaged into solar cell modules. Efforts have been made in development of efficient systems for the inspection of solar cells.

The defects occurring in a solar cell are generally classified into internal defects and external defects. The so-called internal defects are mainly referred to as micro-cracks caused by tiny fractures in the wafer structure. Although the micro-cracks are normally quite small in width and occur only at a certain depth range in the wafer structure, they tend to block the transmission of photons within a solar cell, causing a significant reduction in energy conversion efficiency. That is to say, a number of tiny internal defects could still interfere with the output power of a solar cell. After the soar cell experiences sunlight irradiation and ambient temperature fluctuation for a period of time, the micro-cracks may extend and more seriously affect the output power of the solar cell. The situation may get worse if water (H2O) and hydrogen (H2) invade into the solar cell through the micro-cracks.

Figure 1:
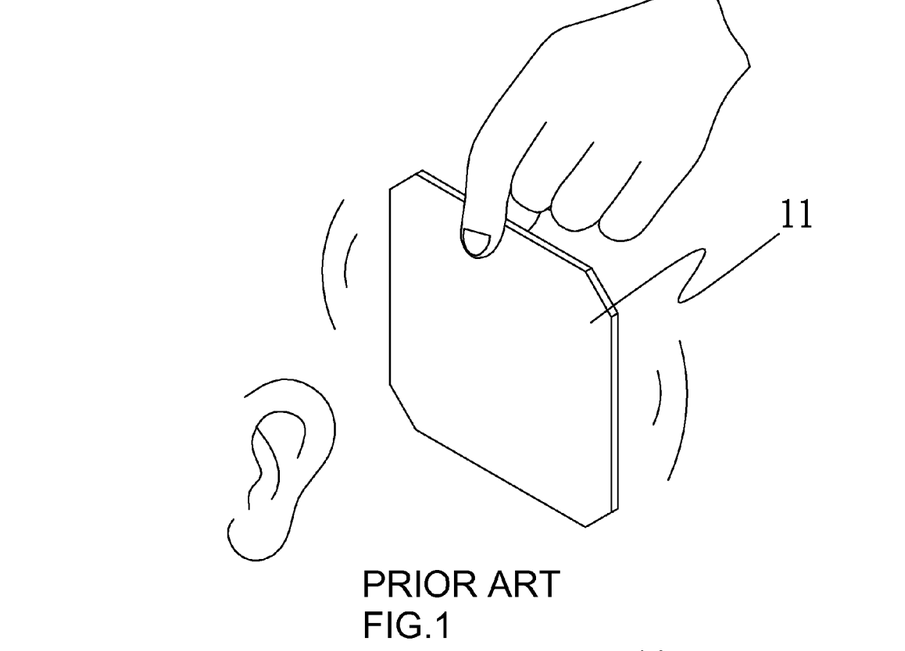
FIG. 1 is a schematic diagram of a conventional inspection process, in which a worker shakes a solar wafer and determines whether or not the wafer includes internal microcracks by recognizing a characteristic noise thereof.

As such, the inspection of solar cells focuses on detecting the apparent damages, defects and micro-cracks. Among them, the micro-cracks are especially difficult to be detected by automatic inspection systems. FIG. 1 depicts an earlier inspection process, in which a solar wafer 11 is pinched and gently shaken by a sophisticated worker who is capable of identifying a solar cell having internal micro-cracks by recognizing a characteristic noise thereof. The process is certainly unreliable due to the inconsistent magnitude of hand shaking and the limited perception of human ears, not to mention that the solar wafer 11 would suffer from damage if it is shaken by undue force.

Figure 2:
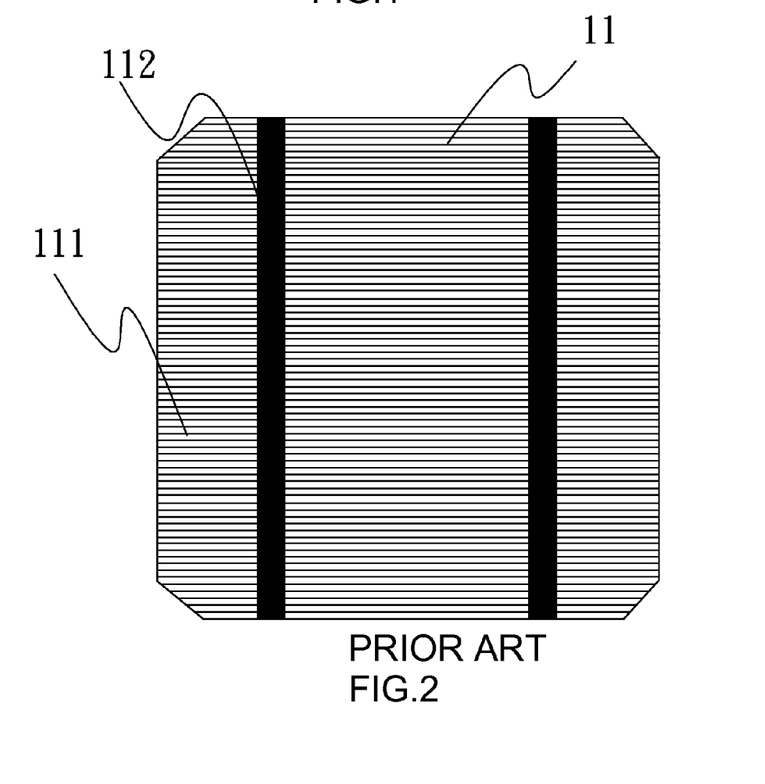
FIG. 2 is a schematic top view of the light receiving surface of a commonly used solar wafer.
Figure 3:
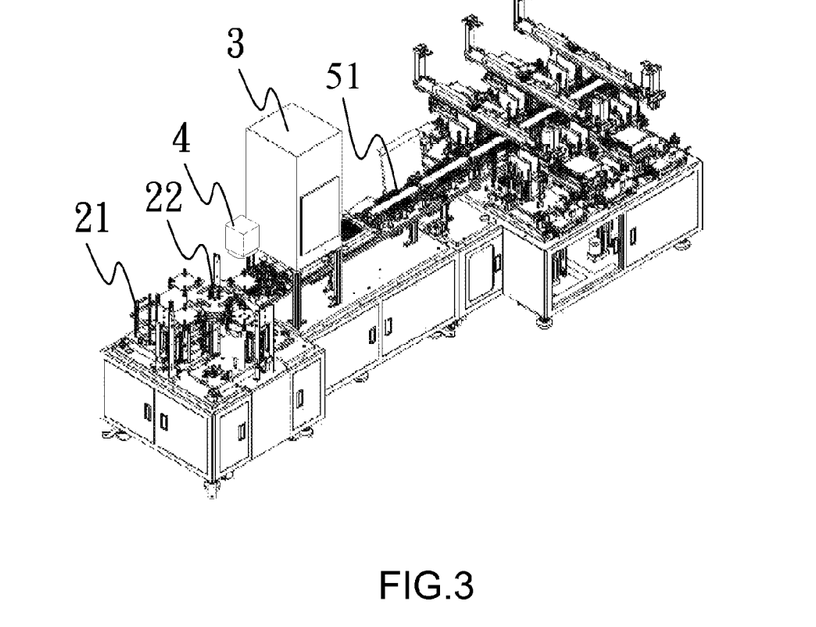
FIG. 3 is a schematic diagram illustrating an inspection machine proposed earlier by the applicant.

In order to satisfy the needs for a high-throughput automatic inspection system that performs a standardized inspection process, a conventional solar wafer 11 as shown in FIG. 2 is proposed for being placed under inspection, which comprises a light-receiving surface 111 for receiving incident sunlight and converting the same into electric energy, and a number of conductive buses 112 that output the electric energy. A conventional inspection machine is shown in FIG. 3, comprising a feeding cassette 21 in which a stack of solar wafers 11 are disposed for further inspection. A solar wafer 11 is picked up by a pick-and-place device 22 and then placed on a conveyor 51. An optical inspection system 4 and an illumination inspection system 3 are provided along the path of the conveyor 51. The optical inspection system 4 includes a camera device for taking images of surface structures of the respective solar wafers 11 to detect defects present on the surfaces of the wafers 11. The illumination inspection system 3 subsequently projects light towards the respective solar wafers 11 under test, and a probe is driven into contact with the conductive buses 112 of the respective wafers 11. The solar wafers 11 are sorted based on the detection data thus obtained.

Figure 4:
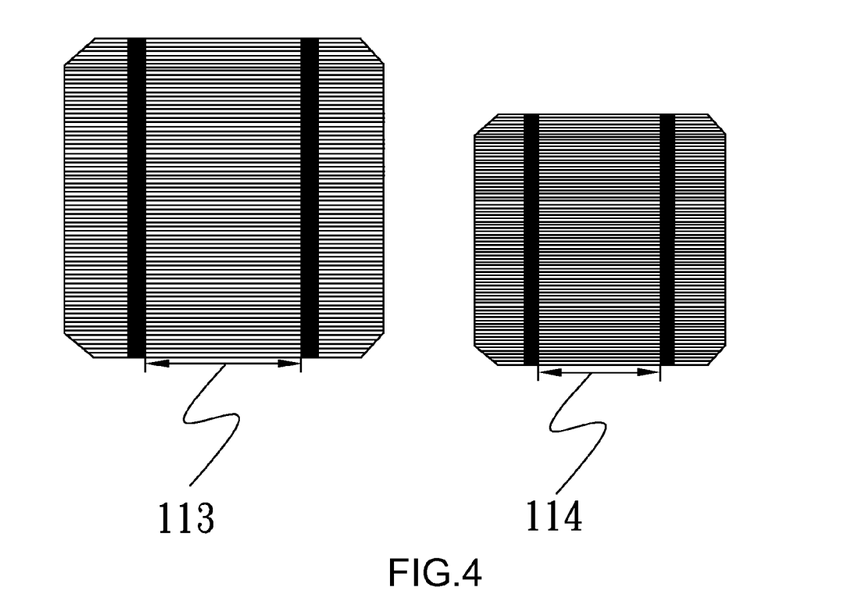
FIG. 4 is a schematic top view of the light receiving surfaces of commonly used 5- and 6-inch solar wafers.

Solar wafers are fabricated to be normally 5 or 6 inches and less frequently 4 inches in diameter. As shown in FIG. 4, the commonly used 5- and 6-inch solar wafers also vary in the distance (113 vs. 114) between the conductive buses, in addition to their diameters. As a consequence, the conventional inspection machine can only inspect solar wafers having the same dimensions. A great deal of manual work must be done to adjust the inspection machine and replace test fixtures if the wafers to be tested are changed from one size to another. However, the adjustment is so time-consuming as to reduce the productivity and so complicated that maintenance operations can easily go wrong to result in a test failure and even cause damage to the wafers under test. All of these disadvantages lead to high manufacture cost and low productivity. Therefore, a gist of the invention disclosed herein is to provide an inspection machine that can be adjusted rapidly and automatically to fulfill the needs of inspecting solar wafers with various dimensions.

SUMMARY OF THE INVENTION

Accordingly, an object of the present invention is to provide a practically feasible, automatic inspection machine for inspecting solar wafers with various dimensions.

Another object of the invention is to provide an inspection machine, which is effective in automatically adjusting the positions of and the distances between the respective elements responsible for processing a solar wafer in accordance with the size of the solar wafer, thereby reducing the incidence of machine failure due to human negligence.

It is still another object of the invention to provide a distance adjustment system equipped with a holder for registering and maintaining a solar wafer in a predetermined inspection position, wherein the clamping gap of the holder can be adjusted automatically in accordance with the size of the solar wafer under test.

It is still another object of the invention to provide a distance adjustment system equipped with robotic arms and a number of probes driven by the robotic arms, wherein the distance between the probes can be adjusted in accordance with the size of the solar wafer under test.

The present invention therefore provides a distance adjustment system for use in a solar wafer inspection machine adapted for inspecting solar wafers having various width dimensions. The solar wafers each have a light receiving surface and a plurality of conductive buses formed on the light receiving surface and adapted for outputting electric energy converted from incident light. The conductive buses are spaced apart from one other in way of corresponding to the width dimension of the corresponding solar wafer. The inspection machine comprises a conveying system for carrying the solar wafers along a conveying path, an optical inspection system mounted in corresponding to at least one image pickup position along the conveying path, and an illumination inspection system mounted in corresponding to at least one opto-electrical inspection position along the conveying path. The distance adjustment system comprises a plurality of registering devices, each comprising a holder for maintaining one of the solar wafers in position along its width direction when the solar wafer is transferred by the conveying system to the at least one image pickup position or the at least one opto-electrical inspection position. The distance adjustment system further comprises an adjustment device that performs adjustment based on sizes of the solar wafers. The adjustment device comprises an input interface for inputting data regarding the sizes of the solar wafers and a processor for driving the registering devices in such a manner that clamping gaps of the respective holders and the distances between respective contact electrodes are adjusted in corresponding to the size data of the solar wafers input via the input interface.

The invention further provides a solar wafer inspection machine provided with a distance adjustment system and adapted for inspecting solar wafers having various width dimensions. The solar wafers each have a light receiving surface and a plurality of conductive buses formed on the light receiving surface and adapted for outputting electric energy converted from incident light. The conductive buses are spaced apart from one other in way of corresponding to the width dimension of the corresponding solar wafer. The inspection machine comprises a base; a conveying system disposed on the base for carrying the solar wafers along a conveying path; an optical inspection system mounted in corresponding to at least one image pickup position along the conveying path; an illumination inspection system mounted in corresponding to at least one opto-electrical inspection position along the conveying path; and a distance adjustment system. The distance adjustment system comprises a plurality of registering devices, each comprising a holder for maintaining one of the solar wafers in position along its width direction when the solar wafer is transferred by the conveying system to the at least one image pickup position or the at least one opto-electrical inspection position. The inspection machine also comprises a probing device. The probing device includes a plurality of contact electrodes arranged in corresponding to the conductive buses of the solar wafer held in the at least one opto-electrical inspection position, and a driving member for bringing the contact electrodes into contact with or away from the conductive buses of the solar wafer. The distance adjustment system further comprises an adjustment device that performs adjustment based on sizes of the solar wafers. The adjustment device comprises an input interface for inputting data regarding the sizes of the solar wafers, and a processor for driving the registering devices in such a manner that clamping gaps of the respective holders and the distances between respective contact electrodes are adjusted in corresponding to the size data of the solar wafers input via the input interface.

During the inspection operation, the conveyor is used to deliver a solar wafer to be tested to an inspection position corresponding to the optical inspection system, at which the solar wafer is subjected to inspection for the surface and color appearance thereof. The solar wafer is then transferred by the conveyor to an opto-electrical inspection position, at which the robotic arms are used to move a set of probes into contact with the conductive buses of the solar wafer. The illumination inspection system then projects light to the light receiving surface of the solar wafer and an opto-electrical inspection is carried out by analyzing the electric energy passing through the probes. In the case where the wafers to be tested are to be changed from one size to another, the adjustment device is used to adjust the clamping gap of the holder and the distance between the probes driven by the robotic arms, thereby allowing the use a single machine to inspect solar wafers with different width dimensions. Finally, the data obtained from the inspection operations are collected and transmitted to the sorting system, at which the tested solar wafers are sorted into different grades based on the inspection data. Since the holders used to clamp the wafers in position and the probes used to conduct the electric energy converted from light energy are all adjusted in batch by the adjustment device, the inspection machine disclosed herein can operate automatically even when the wafers to be tested are changed from one size to another. The invention removes the manual work required in the conventional operation and, therefore, reduces the incidence of test failure and wafer damage caused by human negligence and elevates the productivity and yield. The invention has successfully achieved the objects described above accordingly.

BRIEF DESCRIPTION OF THE DRAWINGS

The above and other objects, features and effects of the invention will become apparent with reference to the following description of the preferred embodiments taken in conjunction with the accompanying drawings, in which.

DETAILED DESCRIPTION OF THE INVENTION

Figure 5:
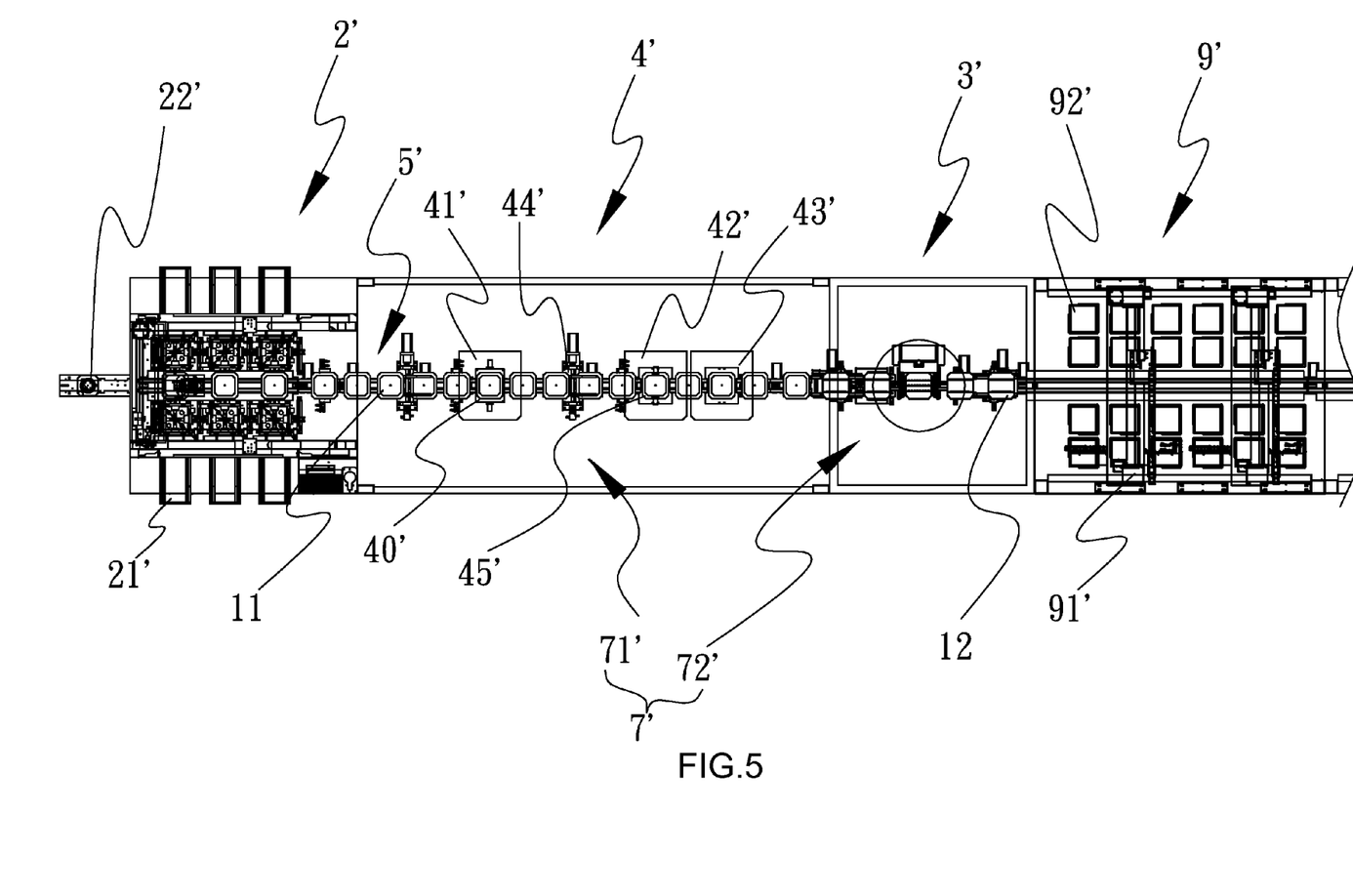
FIG. 5 is a schematic top view of the inspection machine according to the first preferred embodiment of the invention.
Figure 6:
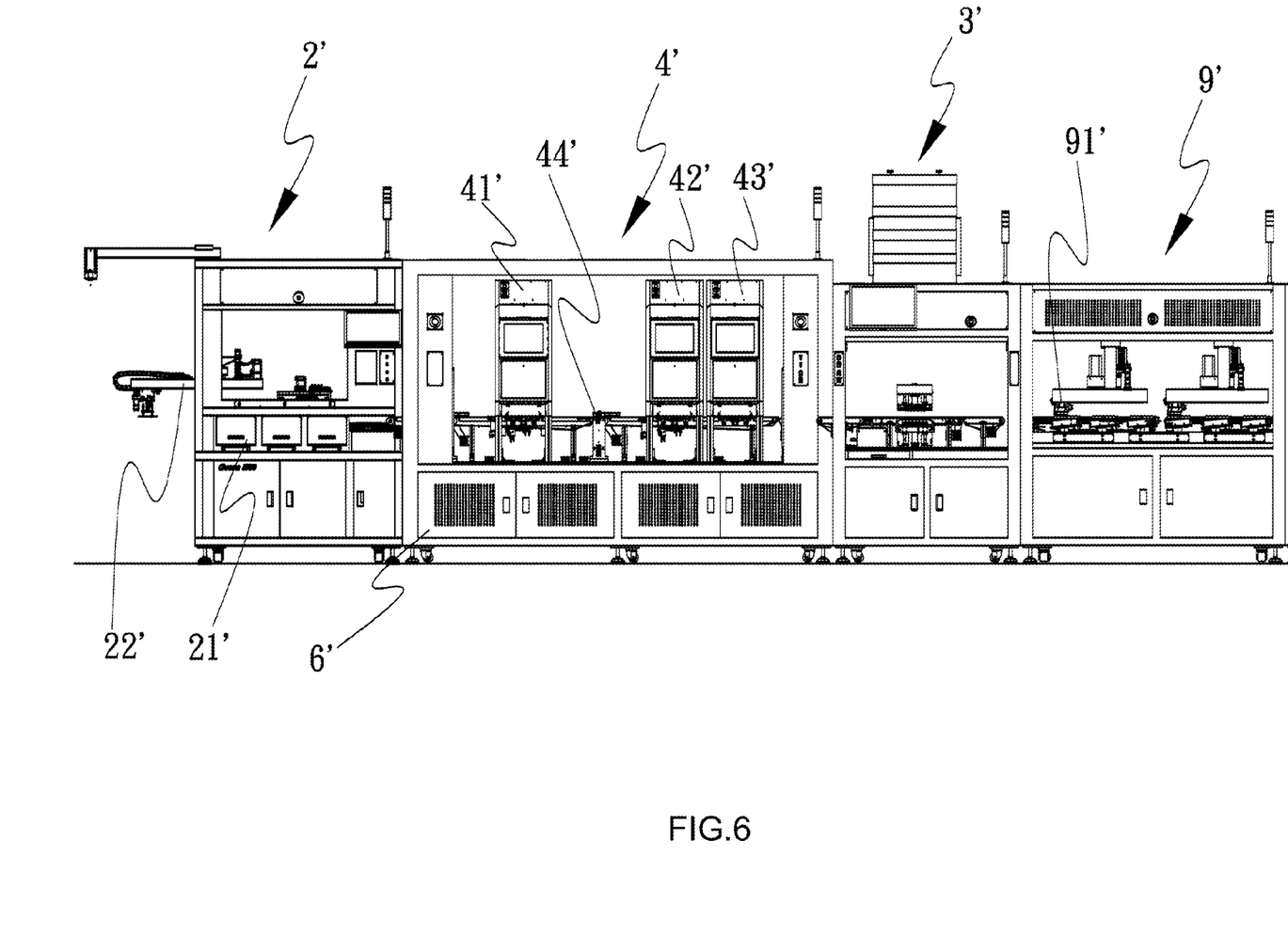
FIG. 6 is a schematic side view of the inspection machine shown in FIG. 5.

According to a preferred embodiment of the invention, the solar wafers to be tested herein are identical to the wafers 11 shown in FIGS. 2 and 4, each comprising a light-receiving surface 111 on which a number of conductive buses 112 are formed to output electric energy. The solar wafers 11 to be tested herein may vary in diameter and in the distance 113, 114 between the conductive buses 112. The inventive inspection machine is illustrated in FIGS. 5 and 6, comprising a base 6' and a series of automatic operation systems mounted on the base 6'. The automatic operation systems include a feeding system 2', a conveying system 5', an optical inspection system 4', an illumination inspection system 3', a distance adjustment system 7', a size adjustment device 8' and a sorting system 9'. The feeding system 2' disclosed herein includes a plurality of pick-and-place devices 22', and at least two rest positions at each of which a feeding cassette 21' is disposed for accommodating a stack of solar wafers 11. The pick-and-place devices 22' are employed to pick up the solar wafers 11 from the feeding cassettes 21', one at a time.

Figure 7:
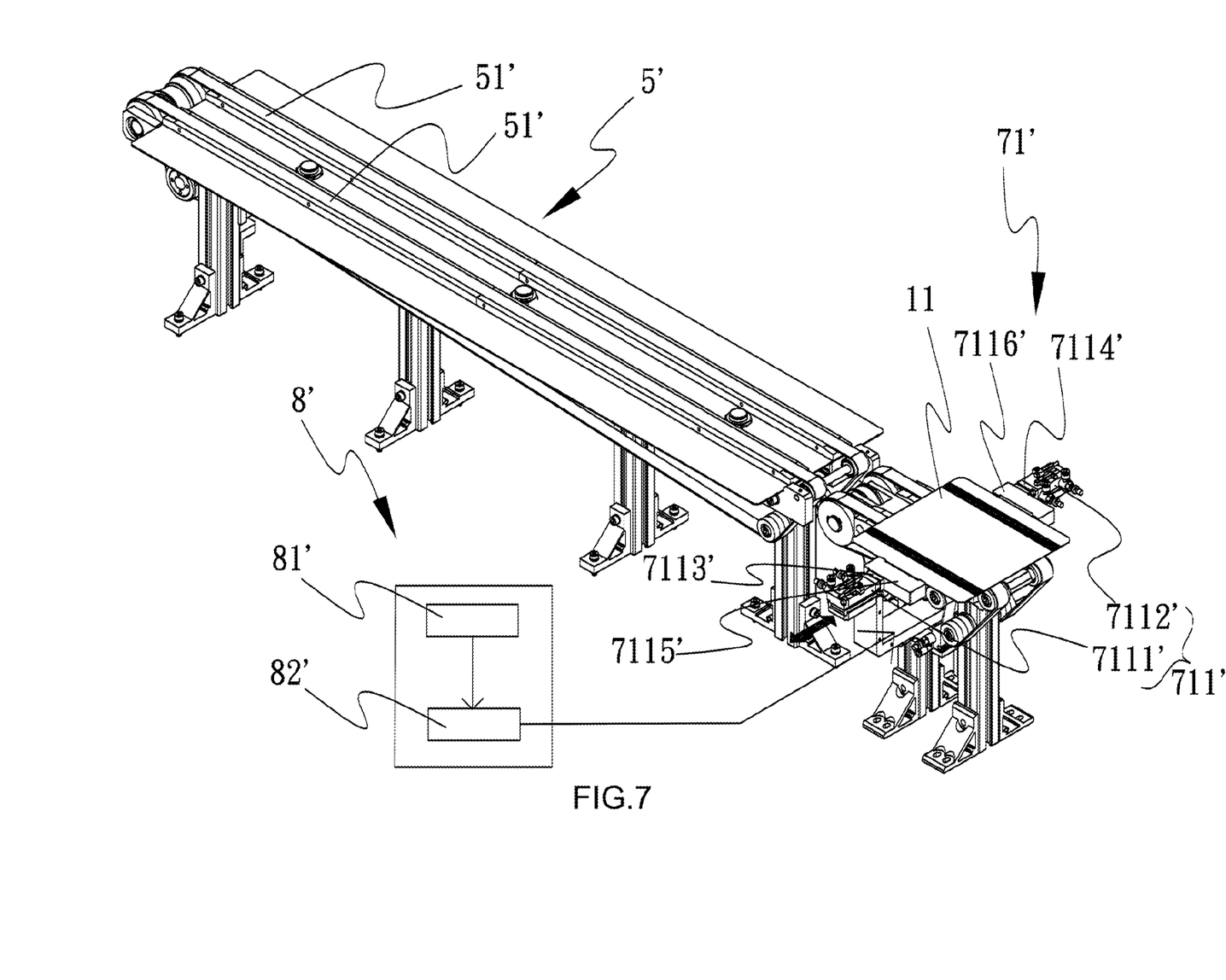
FIG. 7 is a schematic perspective diagram showing the conveying system and the distance adjustment system mounted in the inspection machine shown in FIG. 5.

Now referring to FIG. 7, the conveying system 5' includes a conveyor 51'. An optical inspection system 4' and an illumination inspection system 3' are provided along the path of the conveyor 51'. During the inspection, the respective pick-and-place devices 22' pick up the solar wafers 11 from the feeding cassettes 21' and place the respective solar wafers on the conveyor 51' in such a manner that the light receiving surfaces 111 of the respective solar wafers 11 are oriented to face downwardly with the back surfaces of the respective solar wafers 11 facing upwardly. The respective solar wafers 11 are moved to an image pickup position corresponding to the optical inspection system 4'. Meanwhile, a registering device 71' equipped in the distance adjustment system 7' is used to register the respective solar wafers in position.

The registration operation described herein is carried out by a holder 711' provided in the registering device 71'. The holder 711' is composed of a stationary arm 7111' and a movable arm 7112'. The registration operation is performed by moving the movable arm 7112' towards the stationary arm 7111' along a width direction of the solar wafer 11 as indicated by the bolded arrow in FIG. 7, so that the wafer 11 placed on the conveyor 51' is clamped by the holder 711' and maintained in a predetermined position for being subjected to inspection. In addition, the stationary arm 7111' has a body 7113' provided with a cushion portion 7115' and the movable arm 7112' has a body 7114' provided with a cushion portion 7116'. The cushion portions 7115' and 7116' are arranged to face each other, so as to protect the solar wafer 11 from damage by an uneven clamping stress during the registration operation.

In order to fulfill the needs of inspecting solar wafers with various width dimensions, the size adjustment device 8' is adapted to drive the movable arm 7112' to make the clamping gap of the holder 711' adjustable. The adjustment is carried out by inputting the data regarding the width dimension of the solar wafers to be tested to a processor 82' via an input interface 81' and then allowing the processor 82' to adjust the clamping gap of the holder 711' based on the input data to match with the width dimension of the wafer.

The optical inspection is initiated after the solar wafer 11 is transported to an optical inspection position 40' and clamped in position by the holder 711'. The optical inspection system 4' according to the invention may by way of example comprise a first camera 41' that serves as a back surface detector to take an image of the back surface of the solar wafer 11 under test. Afterwards, a flipping device 44' is used to turn over the solar wafer 11 as indicated by the arrow in FIG. 8, so that the light receiving surface 111 of the wafer 11 is oriented to face upwardly with the back surface thereof facing downwardly, allowing a second camera 42' to function as a light-receiving surface detector for taking an image of the light receiving surface of the solar wafer 11. The back surface detector 41' and the light-receiving surface detector 42' are used to determine whether there is any surface defect or flawed layout present on the solar wafer 11.

Figure 8:
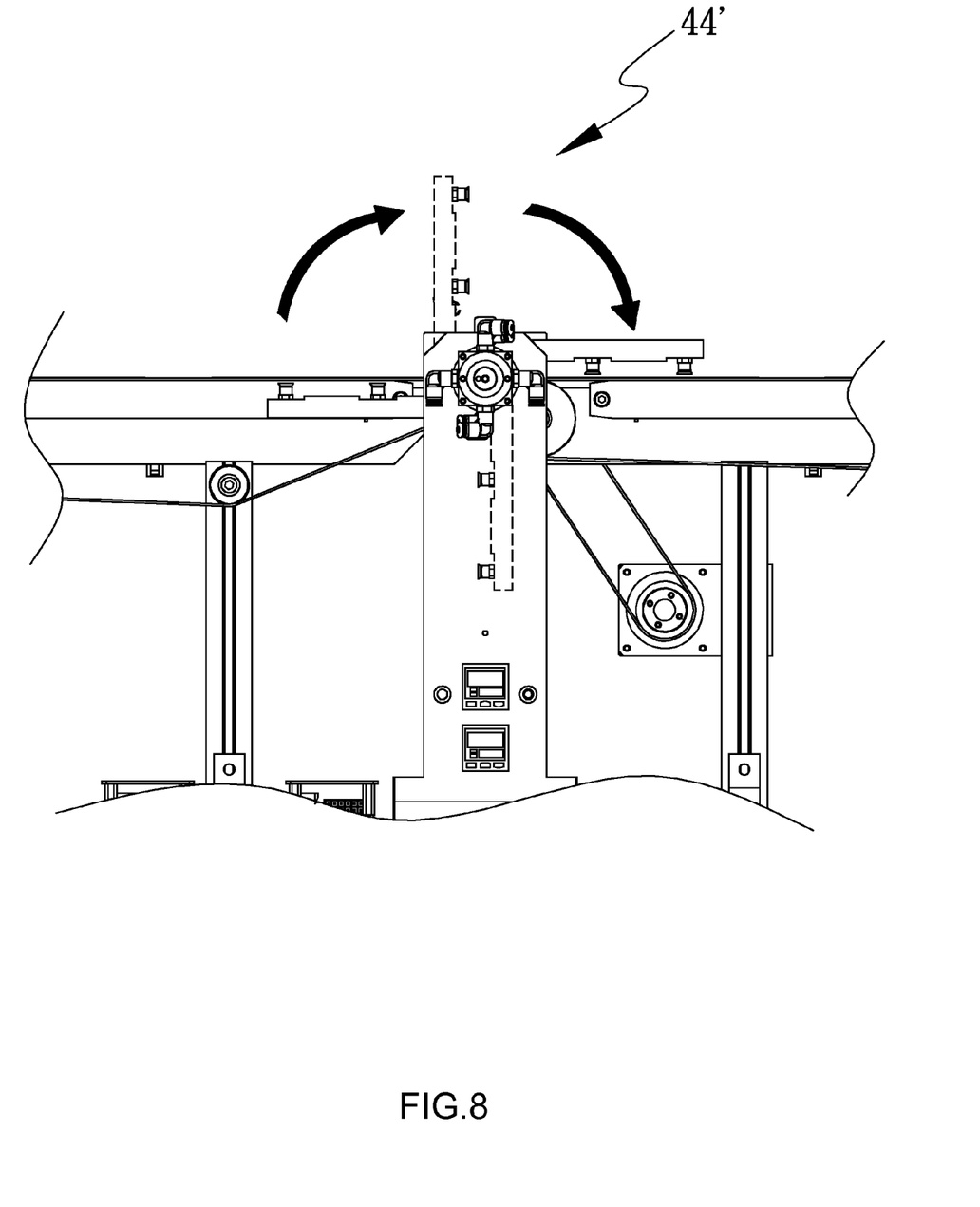
FIG. 8 is a schematic side view of the flipping device mounted in the inspection machine shown in FIG. 5.

In order to prevent the solar wafer 11 from offset during the turning-over operation, an additional holder 711' is installed at an optical inspection position 45' for registering the wafer 11 in position. Then, a third camera 43' acts as a color sensor to distinguish the color appearance of the solar wafer 11, and the data thus obtained are transmitted to a controller system to control the subsequent sorting operation performed by the sorting system 9'. While the holders 711' are mounted at the image pickup positions of the back surface detector 41' and the light-receiving surface detector 42' according to this embodiment, it is apparent that the holder 711' can be installed at every image pickup position to ensure a precise registration of the wafer.

Figure 9:
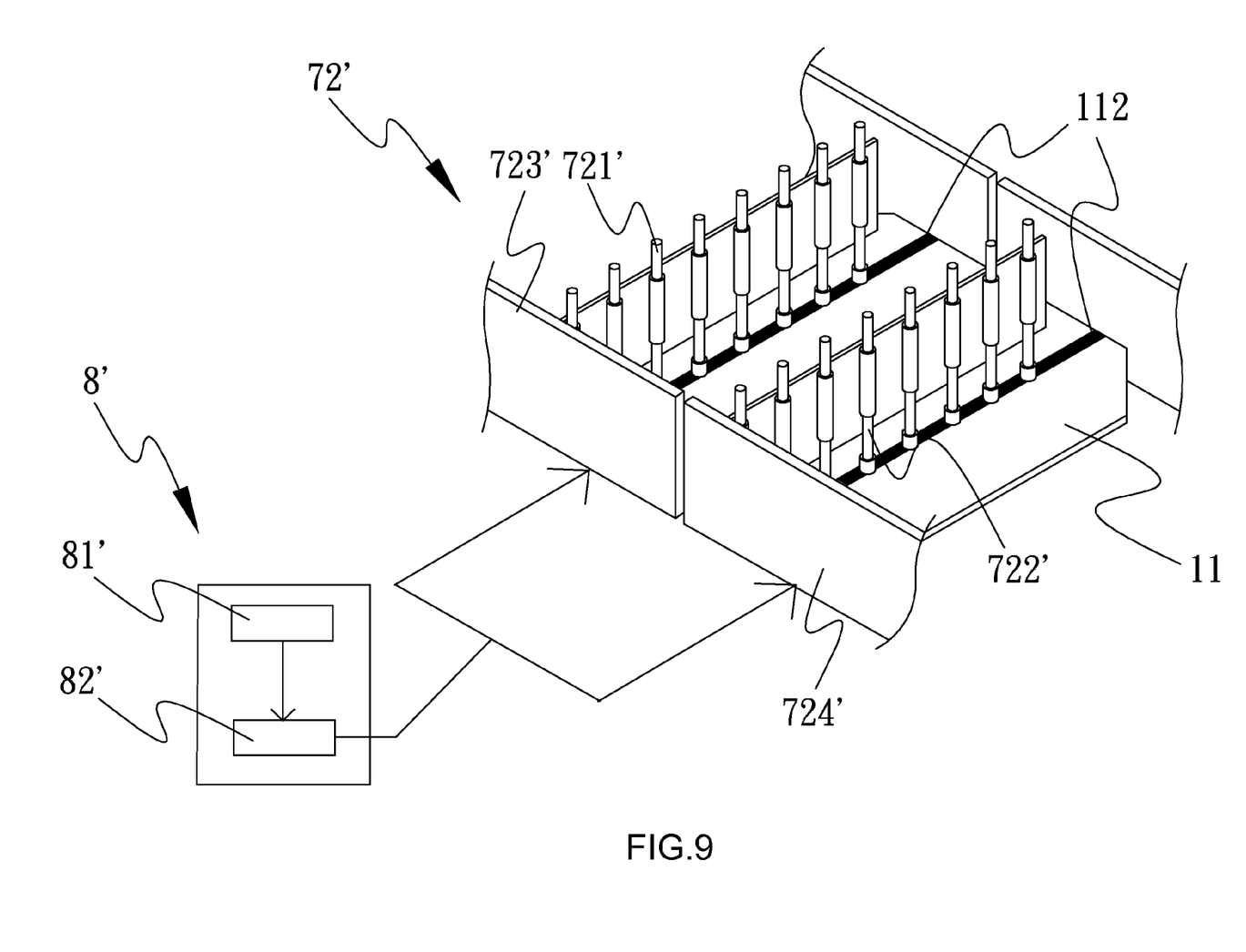
FIG. 9 is a schematic side view showing that the probes are driven by the robotic arms mounted in the inspection machine shown in FIG. 5.

After the completion of the surface inspection, the solar wafer 11 is transferred by the conveyor 51' to the opto-electrical inspection position to which light from the illumination inspection system 3' is projected. As shown in FIG. 9, the distance adjustment system includes a probing device 72' disposed in corresponding to the opto-electrical inspection position. The probing device 72' may by way of example include probes 721', 722' that function as contact electrodes driven by a driving member, such as robotic arms 723', 724'. The distance between the probes 721' and 722' can be adjusted based on the width dimension of the solar wafer 11 to be tested. The adjustment is achieved as described above by the size adjustment device 8'. That is, an operator may input the data regarding the width dimension of the solar wafers to be tested to the processor 82' via the input interface 81', allowing the processor 82' to move the robotic arms 723', 724' to thereby adjust the distance between the probes 721' and 722'.

When the solar wafer 11 advances to the opto-electrical inspection position, the probes 721', 722' which have been adjusted to space apart from each other in way of corresponding to the width dimension of the solar wafer 11 are driven downwardly by the robotic arms 723', 724', such that the probes 721', 722' are brought into firm contact with the conductive buses 112 of the solar wafer 11. The illumination inspection system 3' subsequently projects light towards the light receiving surface 111 of the wafer 11, whereby the light received by the light receiving surface 111 is converted into electric energy. The electric energy is then transmitted through the conductive buses 112 and detected by the probes 721', 722'.

Before the tested solar wafer 12 starts to be transferred by the conveyor 51' toward the downstream sorting system 9', the robotic arms 723', 724' are driven to lift up the probes 721', 722' away from the conductive buses 112 of the wafer 12. The tested solar wafers 12 are then sorted by the sorting system 9', based on the inspection data obtained by the optical inspection system 4' and the probes 721', 722'. The sorting system 9' includes a plurality of pick-and-place members 91' used to transfer the sorted wafers 12 to different storage cassettes 92'.

In contrast to the inspection machines known in the art, the solar wafer inspection machine disclosed herein is provided with a distance adjustment device and, hence, the clamping gap of the holders and the distance between the probes are adjustable to correspond to the various width dimensions of the solar wafers to be tested. As a result, the invention is advantageously capable of inspecting solar wafers with different sizes by using a single machine and provides a feasible solution to the conventional problem that a wafer test factory has to purchase a number of different inspection machines with each being used exclusively for solar wafers with a specific size. For a wafer test factory, purchasing a smaller number of inspection machines means cost down, price advantage and space efficiency.

While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, may be made without departing from the spirit and scope of the invention.

What is claimed is:

1. A distance adjustment system for use in a solar wafer inspection machine adapted for inspecting solar wafers having various width dimensions, wherein the solar wafers each have a light receiving surface and a plurality of conductive buses formed on the light receiving surface and adapted for outputting electric energy converted from incident light, the conductive buses being spaced apart from one other in way of corresponding to the width dimension of the corresponding solar wafer, and wherein the inspection machine comprises a conveying system for carrying the solar wafers along a conveying path, an optical inspection system mounted in corresponding to at least one image pickup position along the conveying path, and an illumination inspection system mounted in corresponding to at least one opto-electrical inspection position along the conveying path, the distance adjustment system comprising:

a plurality of registering devices, each comprising a holder for maintaining one of the solar wafers in position along its width direction when the solar wafer is transferred by the conveying system to the at least one image pickup position or the at least one opto-electrical inspection position; and an adjustment device that performs adjustment based on sizes of the solar wafers, comprising:

an input interface for inputting data regarding the sizes of the solar wafers; and a processor for driving the registering devices in such a manner that clamping gaps of the respective holders and the distances between respective contact electrodes are adjusted in corresponding to the size data of the solar wafers input via the input interface.

2. The distance adjustment system according to claim 1, further comprising a probing device which includes:

a plurality of contact electrodes arranged in corresponding to the conductive buses of the solar wafer held in the at least one opto-electrical inspection position; and a driving member for bringing the contact electrodes into contact with or away from the conductive buses of the solar wafer.

3. The distance adjustment system according to claim 2, wherein the driving member is a robotic arm capable of driving the contact electrodes to a contact position where the contact electrodes are brought into contact with the conductive buses of the solar wafer held in the at least one opto-electrical inspection position or to a standby position away from the contact position.

4. The distance adjustment system according to claim 1, wherein the holders each comprise a stationary arm and a movable arm which is movable relative to the stationary arm along the width direction.

5. The distance adjustment system according to claim 4, wherein the stationary arm and the movable arm each have a body provided with a cushion portion, with the two cushion portions arranged to face each other.

6. A solar wafer inspection machine provided with a distance adjustment system and adapted for inspecting solar wafers having various width dimensions, wherein the solar wafers each have a light receiving surface and a plurality of conductive buses formed on the light receiving surface and adapted for outputting electric energy converted from incident light, the conductive buses being spaced apart from one other in way of corresponding to the width dimension of the corresponding solar wafer, the inspection machine comprising:

a base;

a conveying system disposed on the base for carrying the solar wafers along a conveying path;

an optical inspection system mounted in corresponding to at least one image pickup position along the conveying path;

an illumination inspection system mounted in corresponding to at least one opto-electrical inspection position along the conveying path; and a distance adjustment system comprising:

a plurality of registering devices, each comprising a holder for maintaining one of the solar wafers in position along its width direction when the solar wafer is transferred by the conveying system to the at least one image pickup position or the at least one opto-electrical inspection position; and a probing device which includes:

a plurality of contact electrodes arranged in corresponding to the conductive buses of the solar wafer held in the at least one opto-electrical inspection position; and a driving member for bringing the contact electrodes into contact with or away from the conductive buses of the solar wafer; and an adjustment device that performs adjustment based on sizes of the solar wafers, comprising:

an input interface for inputting data regarding the sizes of the solar wafers; and a processor for driving the registering devices in such a manner that clamping gaps of the respective holders and the distances between the respective contact electrodes are adjusted in corresponding to the size data of the solar wafers input via the input interface.

7. The solar wafer inspection machine according to claim 6, wherein the optical inspection system comprises:

a light-receiving surface detector for taking images of the light receiving surfaces of the respective solar wafers;

a back surface detector for taking images of back surfaces of the respective solar wafers opposite to the light receiving surfaces; and a flipping device mounted in corresponding to the conveying system for turning over the solar wafers when they advance to a position between the light-receiving surface detector and the back surface detector.

8. The solar wafer inspection machine according to claim 6, wherein the optical inspection system comprises a color sensor for distinguishing the light receiving surfaces of the respective solar wafers in terms of color appearance.

9. The solar wafer inspection machine according to claim 6, wherein the holders each comprise a stationary arm and a movable arm which is movable relative to the stationary arm along the width direction, and wherein the stationary arm and the movable arm each have a body provided with a cushion portion, with the two cushion portions arranged to face each other.

10. The solar wafer inspection machine according to claim 6, wherein the driving member is a robotic arm capable of driving the contact electrodes to a contact position where the contact electrodes are brought into contact with the conductive buses of the solar wafer held in the at least one opto-electrical inspection position or to a standby position away from the contact position.

* * * * *